United States Patent [19]

Thiel

[11] 4,316,765
[45] Feb. 23, 1982

[54] DETECTION OF DEFECTS IN SEMICONDUCTOR MATERIALS

[75] Inventor: Ferdinand A. Thiel, South Plainfield, N.J.

[73] Assignee: Bell Telephone Laboratories, Incorporated, Murray Hill, N.J.

[21] Appl. No.: 213,997

[22] Filed: Dec. 8, 1980

[51] Int. Cl.³ .......................................... H01L 21/306
[52] U.S. Cl. .................................... 156/626; 156/636; 156/645; 156/647; 156/903; 252/79.2
[58] Field of Search .............. 252/79.2; 156/625, 626, 156/636, 645, 647, 662, 903, 654

[56] References Cited

U.S. PATENT DOCUMENTS 4,100,014  7/1978  Kuhn-Kuhnenfeld et al. .... 156/903 X

OTHER PUBLICATIONS

J. Electrochem. Soc.: Sold State Science, vol. 118, No. 5, May 1971, Selective Etching of Gallium Arsenide Crystals in $H_2SO_4$—$H_2O_2$—$H_2O$ System by Iida et al., pp. 768-771.

*Primary Examiner*—William A. Powell
*Attorney, Agent, or Firm*—Bruce S. Schneider

[57] ABSTRACT

Defect densities in InP and $InP_xAs_{1-x}$ crystals and particularly in zinc-doped LEC-pulled InP crystals are accurately detected using a specific etchant to produce etch pits corresponding to defect sites. This etchant includes $H_2O_2$, $H_2SO_4$, and water.

9 Claims, No Drawings

DETECTION OF DEFECTS IN SEMICONDUCTOR MATERIALS

BACKGROUND OF THE INVENTION

1. Field of the Invention

This invention relates to semiconductor materials and, in particular, to the detection of defects in semiconductor materials.

2. Art Background

Due to its advantageous electrical and crystallographic properties, indium phosphide has been actively considered for use in a variety of semiconductor devices. These devices are contemplated for many diverse applications, e.g., detectors in optical communications and photovoltaics for solar energy collection. For example, it presently appears that optical communication systems will depend on transmission of light in the 0.9 to 1.6 $\mu$m wavelength region. Indium phosphide is generally used as a substrate for or as a heterojunction with semiconductor materials such as $Ga_xIn_{1-x}P_yAs_{1-y}$, having bandgaps appropriate for detection in the 0.93 to 1.65 $\mu$m region. The use of InP is particularly advantageous since the bandgap and electron infinity of InP is suitable for forming rectifying junctions with many semiconductor materials used in applications such as photovoltaics or photodetection. Also, the lattice parameters of InP appropriately matches that of many useful semiconductors and leads to mechanically stable interfaces.

To fabricate a satisfactory device, the materials used to form it should be essentially defect free, i.e., defect densities less than $10^4$ cm$^{-2}$. If materials having a significantly greater defect density are employed inadequate operation, e.g., poor photodetection of the device, is generally the result. In this regard, since it is less expensive to discard unsuitable semiconductor material than to discard unsuitable finished devices, defect measurement before fabrication of a device generally is performed.

The most common method of defect determination is the etch pit method. For InP, wafers that are used for device fabrication typically are cut from a boule produced by a suitable crystal growth method, e.g., liquid encapsulated Czochzalski (LEC) pulling. After the boule is formed, representative slices, e.g., from the top, middle and the bottom of the boule, are taken. These slices generally are cut perpendicular to the growth direction so that the surface of the wafer includes material formed essentially simultaneously. This surface usually is treated with an etchant that produces pits in the wafer surface at defect sites. The number of pits are considered a relative measure of the defect density.

Although numerous etchants for an etch pit determination have been tried for InP, a completely satisfactory etchant has not been found. For example, a 6:6:1 mixture of HCl, $H_2O$ and $HNO_3$ was employed to determine defects in InP (see G. B. Mullin et al, *Journal of Crystal Growth*, 13/14, p. 640, (1972)). Although this etchant was somewhat successful for use with undoped InP, etch pits were not obtained on LEC-pulled zinc-doped InP. This is particularly unfortunate since, presently, zinc doping is a frequently used method for obtaining p-type InP—the type generally used in photodetecting devices. Similarly, an etchant employing 10 ml of water, 40 mg of silver nitrate, 5 grams of $CrO_3$, and 8 ml of HF also was not useful for the etch pit determination of defect densities in zinc doped InP. (See T. Iizuka, *Journal of the Electrochemical Society*, 118, p. 1190 (1971), and G. A. Rozgonyi and T. Iizuka *Journal of the Electrochemical Society*, 120, p. 673, (1973).)

One etchant described by A. Huber and N. T. Linn, *Journal of Crystal Growth*, 29, p. 80 (1975) did show etch pit formation on the (111)B face of zinc-doped InP. However, the results achieved with this etchant depended very strongly on the method of surface preparation. For this reason, poor reproducibility was obtained making the etchant inadequate. (See F. A. Thiel and R. L. Barns, *Journal of the Electrochemical Society*, 126, No. 7, pp. 1272-74 (1979).)

Attempts to adapt etchants used for the etch pit determination of defect densities on semiconductor materials related to InP have not been successful. For example, the use of a solution of 40 parts HCl, 80 parts nitric acid, and 1 part bromine, (see R. C. Clarke et al, *Journal of Materials Science*, 8, p. 1349 (1973)) although useful for etch pit determination in undoped GaP was not successful for the corresponding use with InP. Thus, known InP etchants for defect determination are deficient, and attempts to modify known etchants used in similar determinations on related semiconductor materials have not been availing.

SUMMARY OF THE INVENTION

The use of a mixture of $H_2O_2$, $H_2SO_4$, and water preferably in a 1:3:1 by volume ratio yields easily discernible etch pits on the various crystallographic planes, e.g., (111)A, (111)B, and (100), of InP and in particular, of zinc-doped InP. Additionally, the result is very reproducible and does not critically depend on the method of surface preparation. Thus, the etchant can be used for determining the suitability of a semiconductor boule for use in device manufacture and also is useful for testing the suitability of a particular wafer for use in fabricating a specific device. Further, by using this technique excellent reproducible etch pits are formed on $InP_xAs_{1-x}$.

DETAILED DESCRIPTION

In a preferred embodiment the wafers or other samples with polished surfaces to be tested are immersed in a $H_2O_2$, $H_2SO_4$ and water solution. (Surface preparation of the sample is not critical but is preferably accomplished by lapping with alumina, 2 $\mu$m grit, and then polishing with a basic slurry of silica.) Generally, it is advantageous to use a 1:3:1 by volume mixture of 3% $H_2O_2$ in water, $H_2SO_4$, and water. (This corresponds to a 0.03:3:1.97 mixture of $H_2O_2$, $H_2SO_4$, and $H_2O$.) Although deviations from these proportions are possible and are not precluded, the most easily discerned pits are formed utilizing this solution. The solution is made by first introducing 3 parts of concentrated sulfuric acid into 1 part of deionized water. One part of a 3% solution of $H_2O_2$ is then mixed with the sulfuric acid solution. The etching solution once completely formed has a tendency to degrade somewhat after an extended period. Therefore, it is most desirable to mix only sufficient solution to perform the desired defect density determination and to do this determination directly after preparation of the etchant.

The etchant is heated to a temperature in the range 55 to 80 degrees C., preferably 60 to 65 degrees C. If higher temperatures are employed, etching occurs too rapidly and the accuracy of the defect determination is degraded. If lower temperatures are employed, the etch rate is too low for convenient use. The wafer to be tested is inserted into the heated solution and is kept in the solution until further etch pit formation appears to have terminated. Generally, for defect densities up to $10^7$ cm$^{-2}$ treatment times in the range 30 to 60 minutes are adequate. During the treatment time period, material removed from the wafer has a tendency to precipitate and resettle on the wafer surface. To prevent this phenomenon, it is desirable to stir the solution during the etch procedure.

After etching, the wafer is examined to determine the etch pit density. Generally, examination with an instrument providing a magnification in the range 200 to 500× is sufficient to easily distinguish the etch pits. The number of etch pits yields a measure of the defect density. It is contemplated that this measure preferably be used as a quality control criterion to determine the suitability of a semiconductor boule. This is advantageously done by selecting wafers from the boule cut perpendicularly to the direction of growth and testing these samples to determine if the boule should or should not be used in the manufacture of semiconductor devices. Alternatively, a wafer is selected from a group of wafers that are to be used in devices, and the defect density of the sample wafer determined. If the defect density is excessive, typically the entire batch of wafers is discarded.

The following examples illustrate the condition generally used in the subject invention:

EXAMPLE 1

A zinc-doped (majority carrier concentration of $3 \times 10^{17}$ cm$^{-3}$) boule grown by LEC pulling was oriented along the 111 axis by the Laue x-ray technique. Wafers 28 mil thick were cut along this reference plane using a diamond abrasive device. The slice was then submerged in concentrated HCl for 2 minutes and then removed. The A face of the 111 plane remained dull after this treatment while the B face turned shiny.

The wafer was then mounted on a conventional crystal lapping holder using wax. The crystal was mounted so that the A face was exposed. The wafer was adjusted so that approximately 3 mils of the wafer extended beyond the surface of the holder. An abrasive having particles of approximately 2 to 3 μm in diameter was spread on an optically flat aluminum oxide plate and the wafer was lapped in a figure 8 motion to remove the imperfections produced by the cutting process. Generally, to remove these defects lapping for approximately 2 or 3 minutes is necessary.

After 2 or 3 mils of the projected wafer was removed through the lapping process, the wafer was again adjusted in the holder so that another 2 or 3 mil thickness projected beyond the surface of the holder. The holder was then placed in a bowl feed lapping machine. This machine is a conventional polishing device which rotates and translates the sample holder while simultaneously rotating the lap plate. The lap plate was a steel pad that had a velvet cloth attached to its surface. A silica particle colloidal suspension having a pH of approximately 8.5 (a product such as Nalcoag 1060) was then mixed in a 3 to 1 ratio by volume with 30% $H_2O_2$. This mixture was dripped onto the velvet pad during the polishing process and polishing was continued for approximately 30 to 35 minutes. (This treatment yielded an essentially scratch-free surface under a 30 power magnification examination.) The wafer was removed from the polishing apparatus and from its holder and treated in a vapor degreaser with warmed trichloroethylene. The wafer was removed from the vapor degreaser and sequentially treated with deionized water and methanol. The wafer was then returned to the vapor degreaser and treated with acetone.

A solution was made by mixing 1 part by volume of deionized water with 3 parts of $H_2SO_4$. The solution was allowed to cool. Then 1 part by volume of 3% $H_2O_2$ was added to this solution. (1 part in this context refers to a quantity equal to the amount of water used in making the $H_2SO_4$ solution.) Generally 50 mls of total solution was made by combining 10 ml of water, 30 ml of sulfuric acid, and 10 ml of 3% $H_2O_2$. The 50 ml of etchant was heated on a hot plate to approximately 60 degrees C. and the wafer was immersed in this etchant with its polished side facing up. Periodically, the etchant was agitated to insure that precipitates from the etching process did not settle on the polished wafer surface. After 30 minutes, the wafer was removed and inspected under an optical microscope. If the etch pits had an average size of approximately 4 μm, the pits were then counted as an indication of the defect density. However, if etch pits were significantly smaller than this size, the wafer was returned to the etchant and periodically inspected until this easily observable etch pit size was realized.

EXAMPLE 2

The same process as described in Example 1 was repeated except the 111B face was treated rather than the 111A face.

EXAMPLE 3

The same process as described in Example 1 was repeated except the boule was oriented along the 100 plane and wafers sliced along this plane. Treatment for determining the A or B face was not performed since such surfaces do not exist in this crystallographic plane.

EXAMPLE 4

The same procedure as described in Example 1 was followed with a boule of InP$_{0.95}$As$_{0.05}$. The boule was oriented along the 111 axis, the A face was identified as in Example 1, and the etch pit procedure was followed.

What is claimed is:

1. A process for fabricating a semiconductor device comprising the steps of treating a body comprising a semiconductor material that is made during a fabrication procedure with an etchant to form etch pits in said body corresponding to defects in said semiconductor material, and if said defects are less than an established level fabricating a device by the steps comprising forming an interface between a body comprising a semiconductor material made during said fabricating procedure and an interfacing material characterized in that said etchant is a mixture of water, sulfuric acid and hydrogen peroxide and that said semiconductor material is chosen from the group consisting of indium phosphide and indium arsenide phosphide.

2. The process of claim 1 wherein said water, sulfuric acid, and hydrogen peroxide is in the ratio by volume of 1.97:3:0.03.

3. The process of claim 1 wherein said etchant is heated to a temperature in the range 55 to 80 degrees C.

4. The process of claim 3 wherein said temperature is in the range 60 to 65 degrees C.

5. The process of claim 1 wherein said body is chosen as representative of a plurality of said bodies and said semiconductor devices are fabricated on said bodies if the number of said etch pits in said representative body is less than an established level.

6. A process for determining defect densities in a semiconductor material comprising the steps of treating said material with an etchant to form etch pits characterized in that said semiconductor material is chosen from the group consisting of indium phosphide and indium arsenide phosphide and that said etchant comprises water, sulfuric acid and hydrogen peroxide.

7. The process of claim 6 wherein said water, sulfuric acid and hydrogen peroxide is in the ratio by volume of 1.97:3:0.03.

8. The process of claim 6 wherein said etchant is heated to a temperature in the range 55 to 80 degrees C.

9. The process of claim 8 wherein said temperature is in the range 60 to 65 degrees C.

* * * * *